(12) United States Patent
Liu et al.

(10) Patent No.: US 6,794,235 B1
(45) Date of Patent: Sep. 21, 2004

(54) METHOD OF MANUFACTURING A SEMICONDUCTOR DEVICE HAVING A LOCALIZED HALO IMPLANT

(75) Inventors: Kaiping Liu, Plano, TX (US); Zhiqiang Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/455,088

(22) Filed: Jun. 5, 2003

(51) Int. Cl.⁷ .......................................... H01L 21/8238
(52) U.S. Cl. ..................... 438/199; 257/301; 257/302
(58) Field of Search ................................ 438/199, 217, 438/231, 232, 301, 302, 305, 306

(56) References Cited

U.S. PATENT DOCUMENTS

| | | | |
|---|---|---|---|
| 6,124,616 A | * | 9/2000 | Dennison et al. ........... 257/369 |
| 6,194,278 B1 | | 2/2001 | Rengarajan |
| 6,248,635 B1 | | 6/2001 | Foote et al. |
| 6,362,052 B1 | | 3/2002 | Rangarajan et al. |
| 6,518,135 B1 | * | 2/2003 | Ahn ............................ 438/302 |
| 2003/0148564 A1 | * | 8/2003 | Chang ......................... 438/200 |

* cited by examiner

*Primary Examiner*—Hoai Pham
(74) *Attorney, Agent, or Firm*—Yingsheng Tung; Wade James Brady, III; Frederick J. Telecky, Jr.

(57) ABSTRACT

The present invention provides a semiconductor device 200 having a localized halo implant 250 located therein, a method of manufacture therefore and an integrated circuit including the semiconductor device. In one embodiment, the semiconductor device 200 includes a gate 244 located over a substrate 210, the substrate 210 having a source and a drain 230 located therein. In the same embodiment, located adjacent each of the source and drain 230 are localized halo implants 250, each of the localized halo implants 250 having a vertical implant region 260 and an angled implant region 265. Further, at an intersection of the vertical implant region 260 and the angled implant region 265 is an area of peak concentration.

9 Claims, 15 Drawing Sheets

METHOD OF MANUFACTURING A SEMICONDUCTOR DEVICE HAVING A LOCALIZED HALO IMPLANT

TECHNICAL FIELD OF THE INVENTION

The present invention is directed, in general, to a semiconductor device and, more specifically, to a semiconductor device having a localized halo implant therein and method of manufacture therefor.

BACKGROUND OF THE INVENTION

As the geometries of semiconductor devices and particularly MOS transistors are being scaled to continually shorter gate lengths, there is a requirement for reduction in short channel effects. It is known that these short channel effects can be reduced by the use of non-uniform doping levels in the channel region. One manner of obtaining such non-uniform doping levels in the channel region has been by the use of pocket or halo implants. Both a pocket and a halo implant involve, in addition to the standard source/drain implant, the introduction of an implant which is at an angle of from about 10 to about 80 degrees and preferably about 30 to 40 degrees relative to a normal to the substrate surface. The pocket or halo implant is of opposite conductivity type to that of the source/drain region, is directed partially under the gate electrode and uses the gate electrode as a mask. In this manner, a pocket or halo region is formed which abuts the source/drain region as well as the gate oxide, is within the channel region and extends under the gate electrode, to provide a region between the source/drain and the channel which is more highly doped than the channel region and of like conductivity type.

In an optimal situation, it would be desirable to place the pocket or halo region at least partially under the gate and below the surface of the substrate proximate the source/drain regions. Unfortunately, the pocket and halo depth and doping levels cannot be controlled enough as to precisely place the pocket or halo region in this desired location. For example, because of the present angled Halo process used (of which will be detailed with respect to FIG. 1A below) a substantial portion of the pocket or halo region is located at a surface of the substrate and between the two source/drain regions in the channel region. This location, however, affects the channel mobility of the device, and especially as it attempts to shut off the subsurface current. For this reason, present pocket and halo implants are either not used at all or are used in moderation to minimize the problems inherent in the presence of the pocket or halo implant region in the channel region between the source/drain regions.

A typical process flow as used in the prior art to fabricate a MOS transistor having a pocket or halo implant is shown with reference to FIG. 1A, wherein there is provided a substrate 110 of semiconductor material, such as, for example, silicon, onto which has been formed, in a standard manner, such as by thermal growth or chemical vapor deposition (CVD), a layer of silicon dioxide 120. A polysilicon gate 130 is formed over the silicon dioxide layer 120 in a standard manner, such as by deposition of polysilicon over the silicon dioxide layer 120 with subsequent patterning and etching to form the gate structure 130. At this time, an optional screen oxide can be formed, either thermally or deposited.

Thereafter, a lightly doped drain (LDD) to moderately doped drain (MDD) is formed, generally by a simple ion implantation of phosphorus and/or arsenic for n-channel and boron for p-channel with doses in the range from about 1E13 to about 1E15 atoms/cm$^2$ for LDD to MDD and with an incidence usually near normal to the surface plane. The pocket or halo 140 is then implanted, this being an ion implantation of the same conductivity type as the substrate and opposite conductivity type to the LDD/MDD with lesser doses in the range from about 1E12 to about 1E14 atoms/cm$^2$ with incidence angles usually equal to or greater than the LDD/MDD implantation and possibly rotated about an axis perpendicular to the surface using the gate 130 as a mask. An optional anneal can take place at this point to limit transient enhanced diffusion (TED). A sidewall spacer 150 may then be formed in a standard manner, generally of silicon dioxide, silicon nitride or a combination of silicon dioxide and silicon nitride. Thereafter, source/drain regions 160 may be formed within the substrate 110. Generally, the source/drain regions 160 include doses of about 1E15 atoms/cm$^2$, which are of opposite conductivity type to the pocket or halo implant 140. An optional anneal may be conducted thereafter to activate the dopant. With the subsequent annealing, the source/drain regions 160 are formed with the pocket implant 140 extending thereunder, as well as under the gate 130, to isolate the source/drain regions 160 from the channel 170 as shown in FIG. 1A.

Turning now briefly to FIG. 1B, illustrated is a process simulation image 180 of a semiconductor device similar to the semiconductor device 100 illustrated in FIG. 1A. Notice how the pocket or halo implants 185 are located at a surface of the substrate 190 in the channel region 195 thereof.

Accordingly, what is needed in the art is a semiconductor device and method of manufacture therefor, that does not encounter the pocket or halo implant issues experienced by the prior art structures.

SUMMARY OF THE INVENTION

To address the above-discussed deficiencies of the prior art, the present invention provides a semiconductor device having a localized halo implant located therein, a method of manufacture therefore and an integrated circuit including the semiconductor device. In one embodiment, the semiconductor device includes a gate located over a substrate, the substrate having a source and a drain located therein. In the same embodiment, located adjacent each of the source and drain are localized halo implants, each of the localized halo implants having a vertical implant region and an angled implant region. Further, at an intersection of the vertical implant region and the angled implant region is an area of peak concentration.

Further included within the present invention is a method of manufacturing a semiconductor device having the localized halo implant. The method, in one embodiment, includes forming a vertical implant region in a substrate and a gate over the substrate. The method may further include forming an angled implant region in the substrate wherein an intersection of the vertical implant region and the angled implant region form a localized halo implant having an area of peak concentration under the gate.

Additionally, the present invention provides an integrated circuit including the aforementioned semiconductor device. In addition to that disclosed above, the integrated circuit includes an interlevel dielectric layer located over the gate and having interconnects located therein, wherein the interconnects contact the semiconductor device to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURE. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

Prior Art

DETAILED DESCRIPTION

Figure 2A:
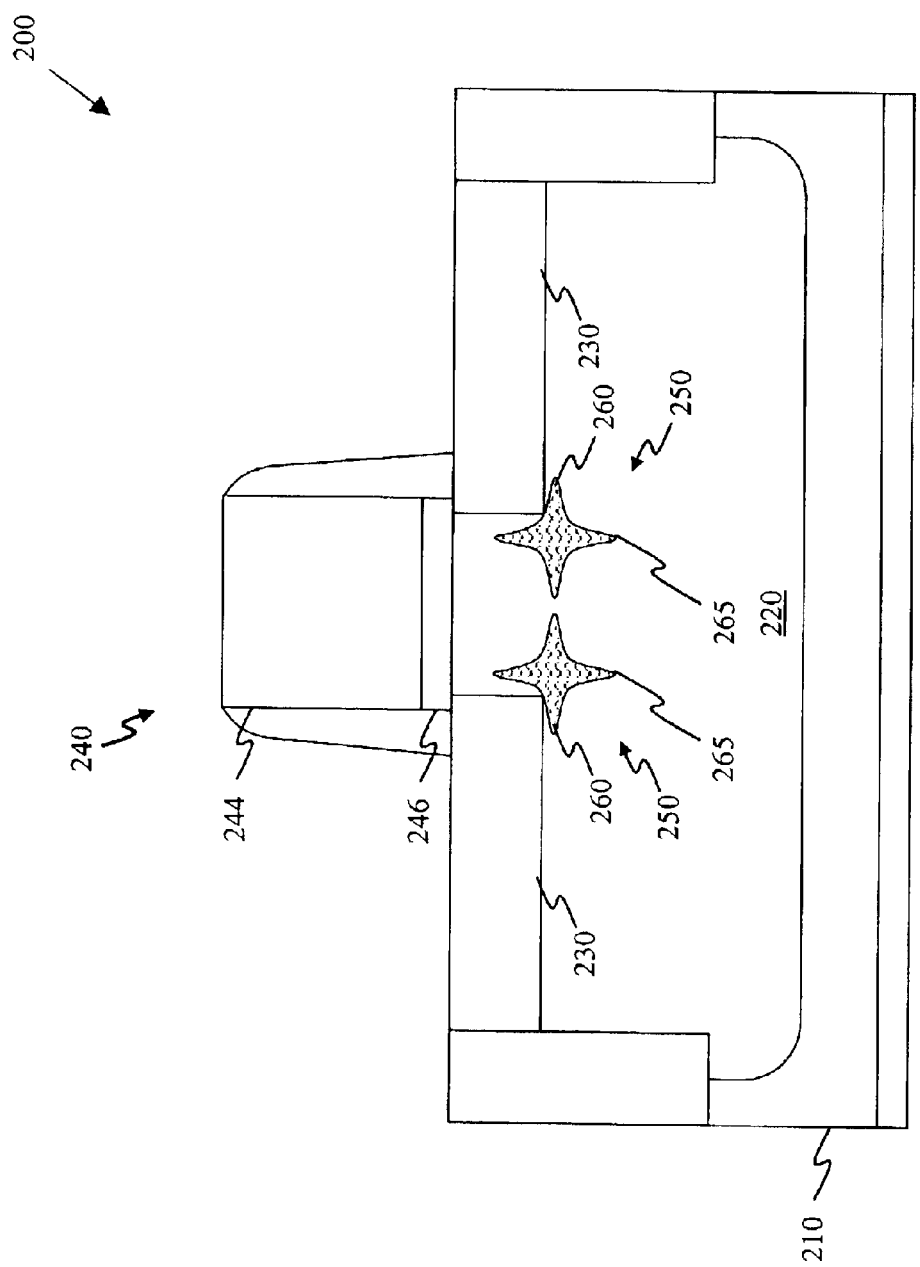
FIG. 2A illustrates a cross-sectional view of one embodiment of a semiconductor device constructed according to the principles of the present invention.

Referring initially to FIG. 2A, illustrated is a cross-sectional view of one embodiment of a semiconductor device 200 constructed according to the principles of the present invention. In the embodiment illustrated in FIG. 2, the semiconductor device 200 includes a substrate 210. Located within the substrate 210 in the embodiment of FIG. 2A is a well region 220. Also located within the substrate 210 may be conventional source and drain regions 230. In the illustrative embodiment of FIG. 2A, a gate structure 240, including a gate 244 and a gate oxide 246, is located over the substrate 210.

Unique to the semiconductor device 200 illustrated in FIG. 2A, are localized halo implants 250 located proximate the source and drain regions 230. As is illustrated in FIG. 2A, the localized halo implants 250 include both a vertical implant region 260 and an angled implant region 265. Uniquely, an intersection of the vertical implant region 260 and the angled implant region 265 forms an area of peak concentration. While not always the case, the area of peak concentration of the embodiment of FIG. 2A is located at least partially under the footprint of the gate 244 and below a surface of the substrate 210. Similarly, among others, the area of peak concentration may have a peak dopant concentration ranging from about 2E18 atoms/cm$^3$ to about 2E19 atoms/cm$^3$.

Figure 1A:
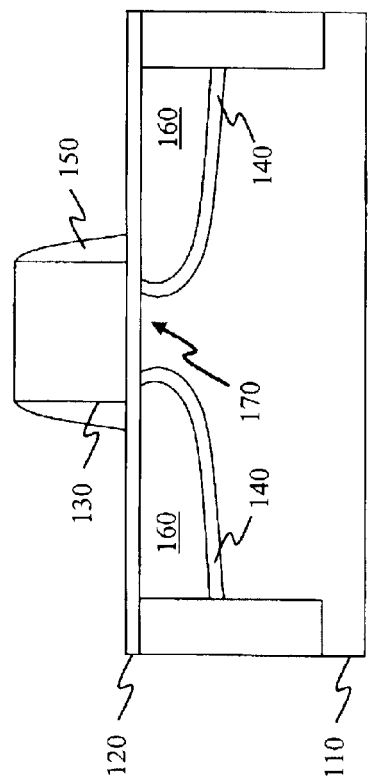
FIG. 1A illustrates a typical process flow as used in the prior art to fabricate a MOS transistor having a pocket or halo implant.
Figure 1B:
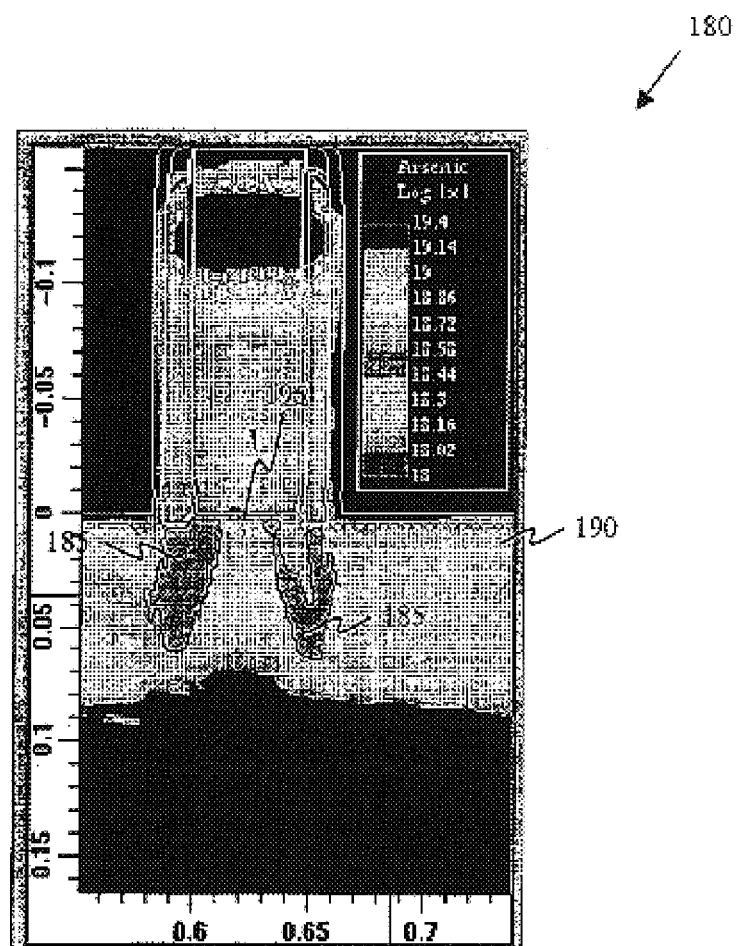
FIG. 1B illustrates a process simulation image of a semiconductor device similar to the semiconductor device illustrated in Prior Art FIG. 1A.

In contrast to the prior art, the localized halo implants 250, and particularly the peak concentration of the localized halo implants, may be precisely positioned (e.g., below a surface of substrate 210) to reduce the channel mobility degradation of the device. Because the prior art structures only have angled implant regions, their halo implants cannot be precisely positioned, like the localized halo implants 250 of the present invention. Actually, no matter how the traditional halo implants of the prior art structures are depicted, tests show that their single angled implant step is incapable of placing the peak concentration below the surface of the substrate., (See image of Prior Art FIG. 1B)

Figure 2B:
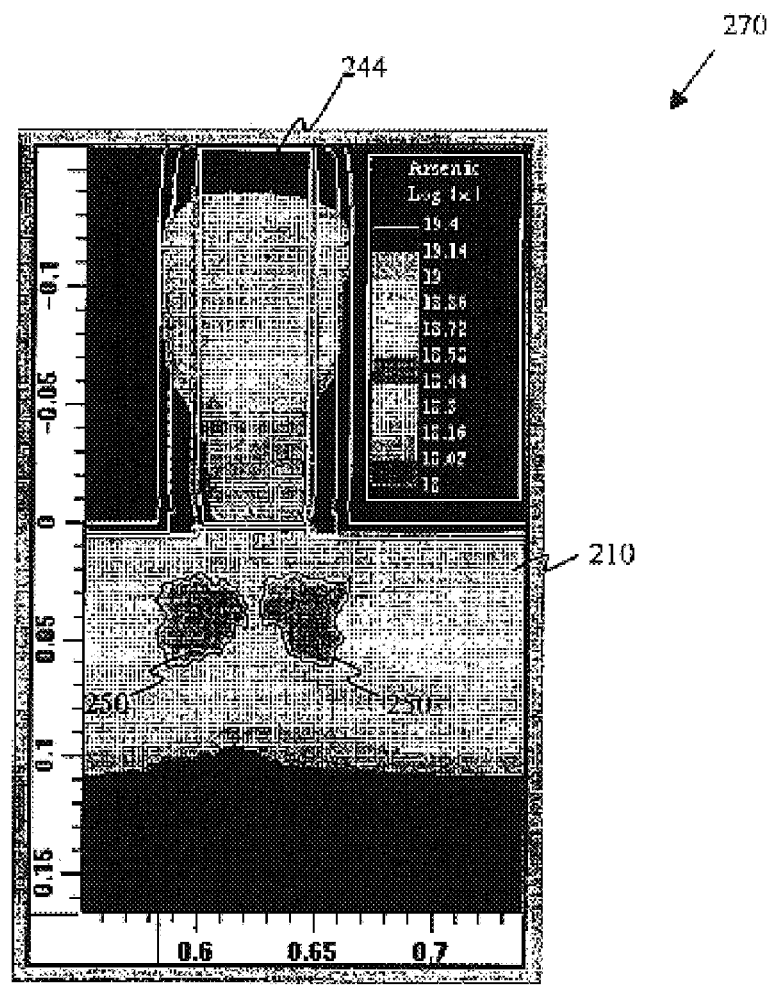
FIG. 2B illustrates a process simulation image of a semiconductor device similar to the semiconductor device shown in FIG. 2A.

Turning briefly to FIG. 2B, illustrated is a process simulation image 270 of a semiconductor device similar to the semiconductor device 200 shown in FIG. 2A. Take notice how the localized halo implants 250, or at least a peak concentration thereof, are located under the footprint of the gate 244 and below a surface of the substrate 210 in the process simulation image 270 of FIG. 2B. Now, referring back to Prior Art FIG. 1B, notice how the prior art halo implants 185, and particularly the peak concentration thereof, are located at the surface of the substrate 190. This positioning of the prior art halo implants 185, causes the prior art structures to have increased channel mobility degradation, as compared to the present invention.

Figure 3:
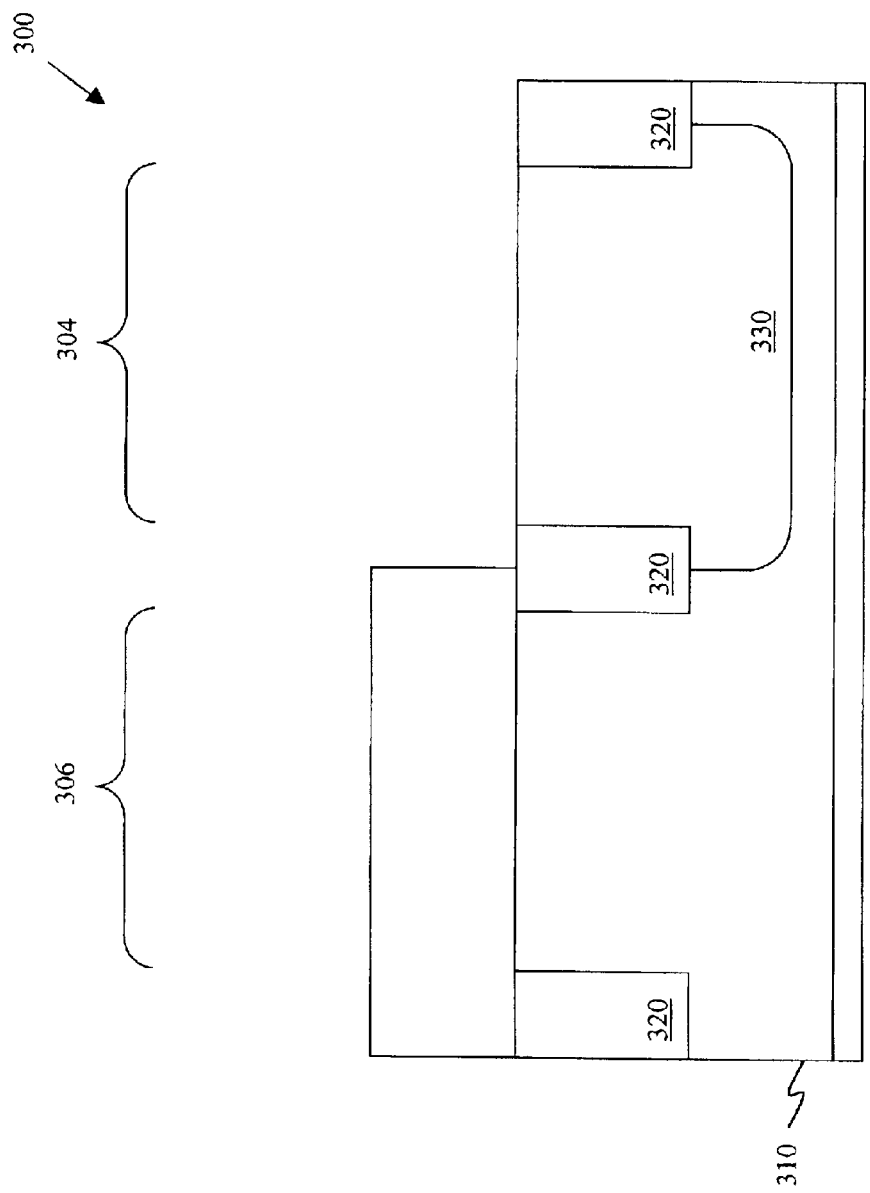
FIG. 3 illustrates a cross-sectional view of a partially completed semiconductor device.

Turning now to FIGS. 3–12, illustrated are cross-sectional views of detailed manufacturing steps instructing how one might, in an advantageous embodiment, manufacture a semiconductor device similar to the semiconductor device 200 depicted in FIG. 2A. FIG. 3 illustrates a cross-sectional view of a partially completed semiconductor device 300. The partially completed semiconductor device 300 includes a substrate 310. The substrate 310 may, in an exemplary embodiment, be any layer located in the partially completed semiconductor device 300, including a wafer itself or a layer located above the wafer (e.g., epitaxial layer). In the embodiment illustrated in FIG. 3, the substrate 310 is a P-type semiconductor substrate; however, one skilled in the art understands that the substrate 310 could be an N-type substrate, without departing from the scope of the present invention.

The embodiment of the partially completed semiconductor device 300 illustrated in FIG. 3, includes two device regions. The two device regions consist of a PMOS device region 304 and an NMOS device region 306. One skilled in the art understands the differences between the PMOS device region 304 and the NMOS device region 306. For example, those skilled in the art understand that the dopant type substantially affects whether a device is a PMOS device or an NMOS device. Those skilled in the art understand that other device regions, similar or dissimilar thereto, may be located to the left or right of the PMOS device region 304 or NMOS device region 306.

Located within the substrate 310 in the embodiment shown in FIG. 3 are shallow trench isolation regions 320. The shallow trench isolation regions 320 are conventional structures formed using conventional techniques and are used to isolate the PMOS device region 304 and NMOS device region 306 from one another. As those skilled in the art understand the various steps used to form these conventional shallow trench isolation regions 320, no further detail will be given.

In the illustrative embodiment of FIG. 3, formed within the substrate 310, and within the PMOS device region 304, is an N-type well region 330. The N-type well region 330, in light of the P-type semiconductor substrate being used, would more than likely contain an N-type dopant. For example, the N-type well region 330 would likely be doped with a dose ranging from about 1E13 atoms/cm$^2$ to about 1E14 atoms/cm$^2$ and at a power ranging from about 100 keV to about 500 keV. What generally results is the N-type well region 330 having an N-type peak dopant concentration ranging from about 5E17 atoms/cm$^3$ to about 1E19 atoms/cm$^3$. As those skilled in the art are well aware of the steps generally used to form the N-type well regions 330, no further details will be given.

In an optional step not shown, a PMOS threshold voltage ($V_t$) implant may be applied to the substrate 310 within the PMOS device region 304. The PMOS threshold voltage ($V_t$) implant, if used, is generally intended to set the long channel (or gate length) transistor threshold voltage and I/O transistor threshold voltage in the PMOS device region 304. Often, a power of about 30 keV to about 60 keV and a dose ranging from about 2E12 atoms/cm$^2$ to about 8E12 atoms/cm$^2$ may be used to form the PMOS threshold voltage ($V_t$) implant.

Similarly, a punch through implant, a channel stop implant and a buried layer implant may optionally be used in the PMOS device region 304. Their purposes include, preventing N-well to N-well punch through, for preventing short channel effects, and for preventing transistor latchup, respectively. Nonetheless, these and other steps have been omitted for clarity.

Figure 4:
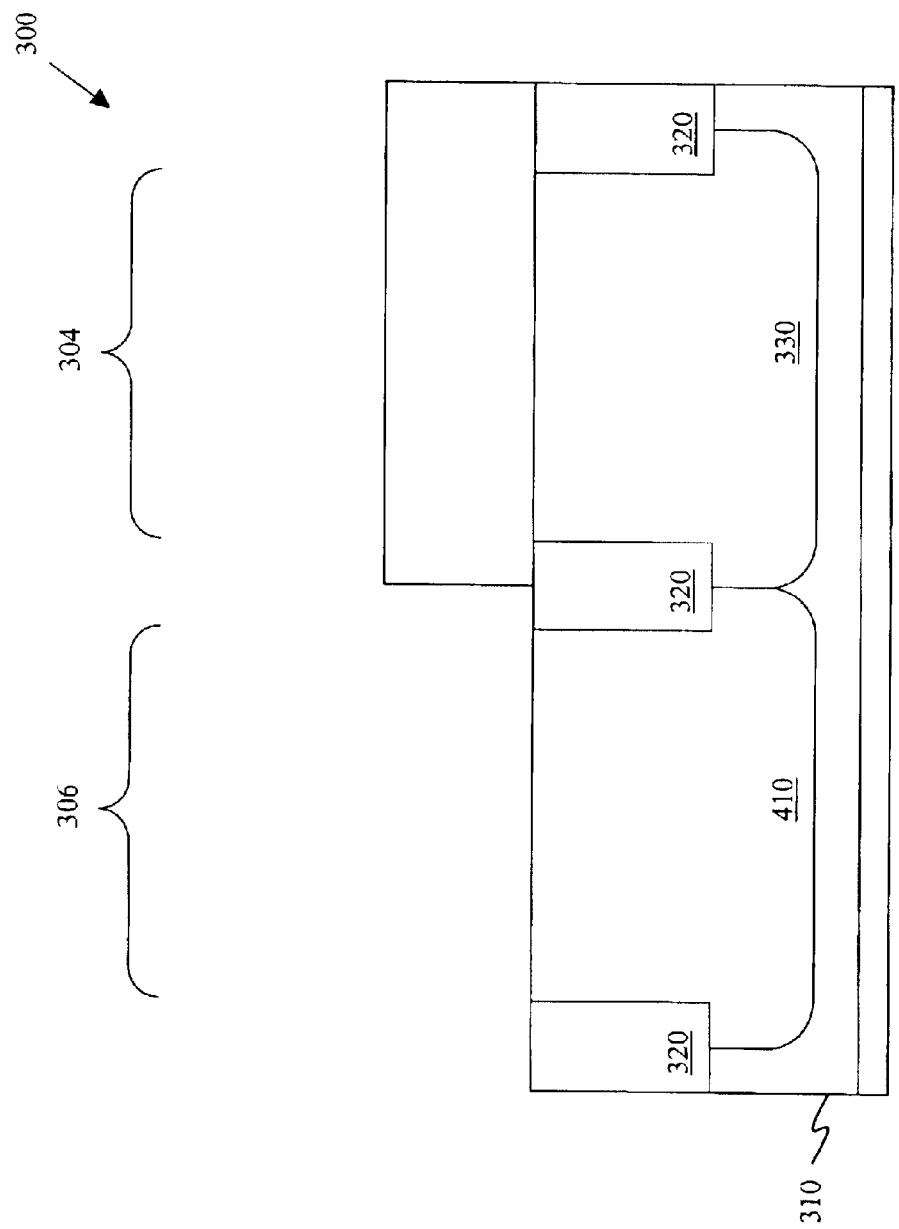
FIG. 4 illustrates a cross-sectional view of the partially completed semiconductor device illustrated in FIG. 3 after forming a P-type well region in the substrate within the NMOS device region.

Turning now to FIG. 4, illustrated is a cross-sectional view of the partially completed semiconductor device 300 illustrated in FIG. 3 after forming a P-type well region 410 in the substrate 310 within the NMOS device region 306. The P-type well region 410 is generally doped with a P-type dopant. For example, the P-type well region 410 would likely be doped with a dose ranging from about 1E13 atoms/cm$^2$ to about 1E14 atoms/cm$^2$ and at a power ranging from about 70 keV to about 300 keV. What generally results is the P-type well region 410 having a P-type peak dopant concentration ranging from about 5E17 atoms/cm$^3$ to about 1E19 atoms/cm$^3$. Similar to above, no further details are warranted.

In an optional step not shown, an NMOS threshold voltage ($V_t$) implant may be applied to the substrate 310 within the NMOS device region 306. The NMOS threshold voltage ($V_t$) implant, if used, is generally intended to set the long channel (or gate length) transistor threshold voltage and I/O transistor threshold voltage in the NMOS device region 306. Often, a power of about 8 keV to about 20 keV and a dose ranging from about 2E12 atoms/cm$^2$ to about 8E12 atoms/cm$^2$ may be used to form the NMOS threshold voltage ($V_t$) implant. Similar to above, a punch through implant, a channel stop implant and a buried layer implant may optionally be used in the NMOS device region 306.

At this point in the manufacturing process in an advantageous embodiment, those transistors having the shortest design gate lengths may be isolated from those having longer design gate lengths. Often this occurs by covering those transistors having the longer design gate lengths with a photoresist layer. It is believed that many of the novel aspects of the present invention are not as applicable to the transistors having the longer design gate lengths, and for this reason the longer design gate lengths are not always subjected to the novel aspects of the present invention. For purposes of the present invention, it will be assumed that the PMOS and NMOS device regions 304, 306, only contain those transistors having the shortest design gate lengths. It should be made clear, however, that the inventive steps of the present invention may be applicable to all types and sizes of transistors.

Figure 5:
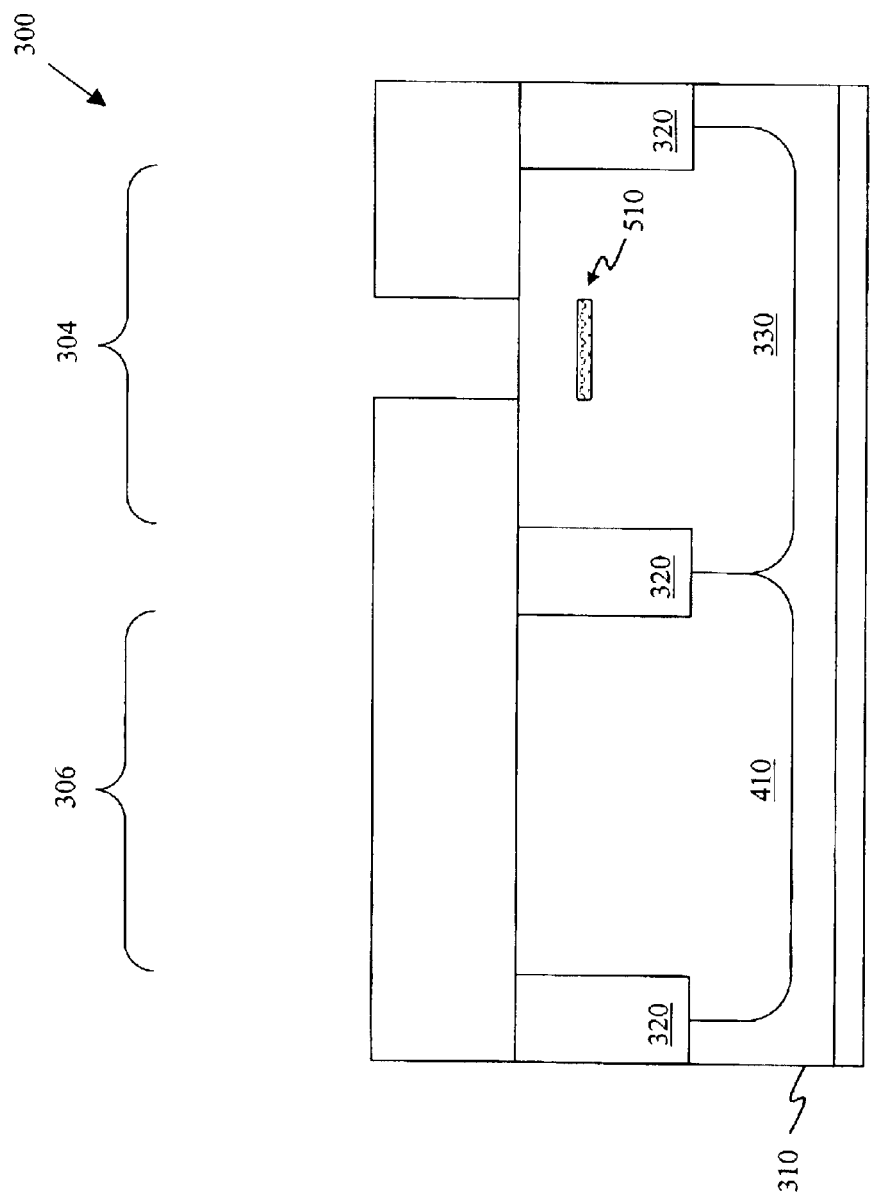
FIG. 5 illustrates a cross-sectional view of the partially completed semiconductor device illustrated in FIG. 4 after placing a PMOS vertical halo implant within the substrate.

Turning now to FIG. 5, illustrated is a cross-sectional view of the partially completed semiconductor device 300 illustrated in FIG. 4 after placing a PMOS vertical halo implant 510 within the substrate 310. Generally, the PMOS vertical halo implant 510 comprises an N-type dopant. For example, in the illustrative embodiment shown in FIG. 5, the PMOS vertical halo implant 510 includes a phosphorous or arsenic dopant and has a peak dopant concentration ranging from about 1E18 atoms/cm$^3$ to about 1E19 atoms/cm$^3$. While the particular dopant used and dopant concentration of the PMOS vertical halo implant 510 has been given, those skilled in the art understand that the present invention should not be limited to such dopants and concentrations.

In the particular embodiment shown in FIG. 5, the PMOS vertical halo implant 510 is located below the surface of the substrate 310 (e.g., not on the surface of the substrate 310 proximate the later formed gate oxide layer). For example, in one particularly advantageous embodiment the PMOS vertical halo implant 510 is located from about 20 nm to about 60 nm below the surface of the substrate 310. Other depths, however, are within the scope of the present invention. Similarly, the PMOS vertical halo implant 510 may optimally be positioned wherein at least a portion of it is located under a footprint of a later formed gate. (See FIG. 7).

The PMOS vertical halo implant 510 may additionally be formed using a variety of different techniques. For example, an optimal technique has the PMOS vertical halo implant 510 being implanted at an angle substantially normal to the surface of the substrate 310. It is believed that any angle within 9 degrees to normal of the substrate 310 will suffice, however, it is further believed that any angle less than about 5 degrees is optimal. This is contrary to the method used to form the traditional halo implants.

The PMOS vertical halo implant 510, in contrast to traditional halo implants, may also be formed using a lower dose implant. For example, the PMOS vertical halo implant 510 may optimally be formed using an N-type dopant dose ranging from about 1E13 atoms/cm$^2$ to about 1E14 atoms/cm$^2$. This N-type dopant dose is generally about half of the conventional dose used to form the traditional halo implants. Nonetheless, the dose is high enough that a standard threshold voltage (V) implant will not suffice. Additionally, the PMOS vertical halo implant 510 may be implanted into the substrate 310 using a power ranging from about 40 keV to about 70 keV.

Figure 6:
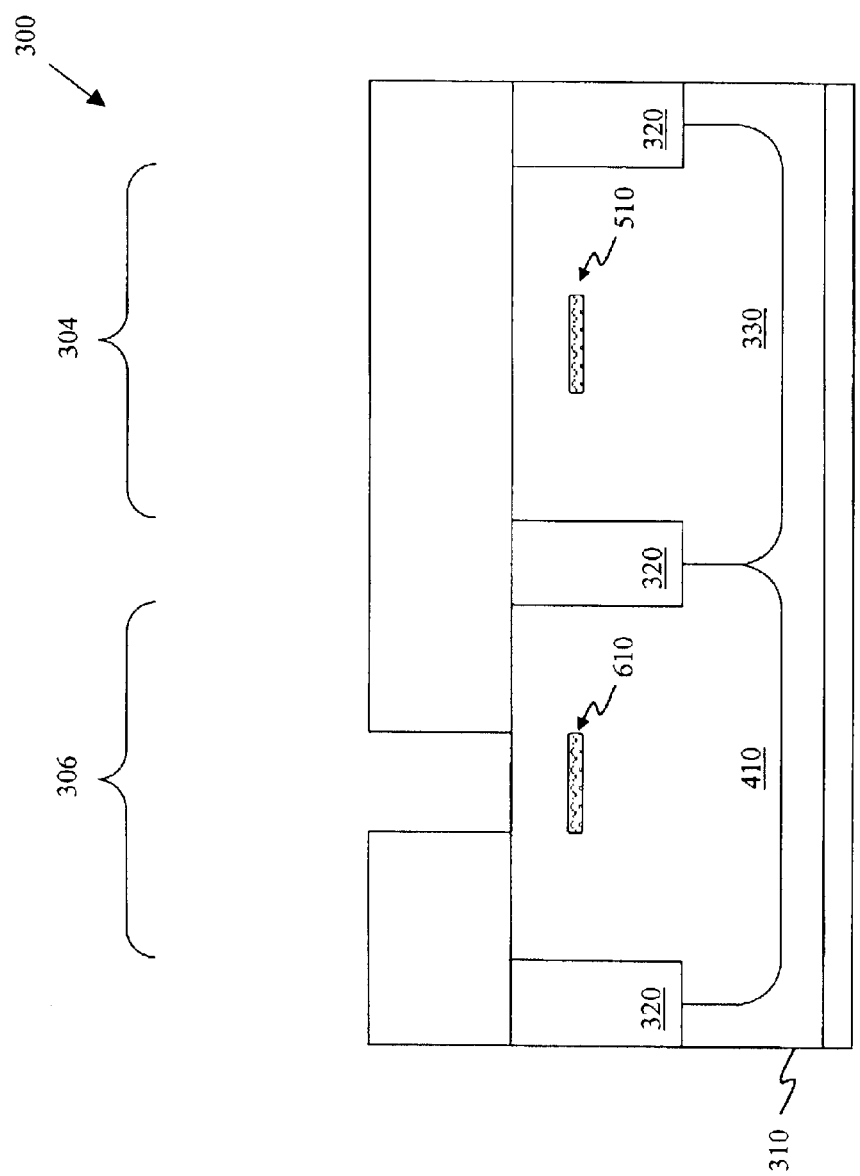
FIG. 6 illustrates a cross-sectional view of the partially completed semiconductor device illustrated in FIG. 5 after placing an NMOS vertical halo implant within the substrate.

Turning now to FIG. 6, illustrated is a cross-sectional view of the partially completed semiconductor device 300 illustrated in FIG. 5 after placing an NMOS vertical halo implant 610 within the substrate 310. Generally, the NMOS vertical halo implant 610 comprises a P-type dopant. For example, in the illustrative embodiment shown in FIG. 5, the NMOS vertical halo implant 610 includes boron and has a peak dopant concentration ranging from about 1E18 atoms/cm$^3$ to about 1E19 atoms/cm$^3$. While the particular dopant used and dopant concentration of the NMOS vertical halo implant 610 has been given, those skilled in the art understand that the present invention should not be limited to such dopants and concentrations.

In the particular embodiment shown in FIG. 6, the NMOS vertical halo implant 610 is located below the surface of the substrate 310 (e.g., not on the surface of the substrate 310 proximate the later formed gate oxide layer). For example, in one particularly advantageous embodiment the NMOS vertical halo implant 610 is located from about 20 nm to about 60 nm below the surface of the substrate 310. Other depths, however, are within the scope of the present invention. Similarly, the NMOS vertical halo implant 610 may optimally be positioned wherein at least a portion of it is located under a footprint of a later formed gate. (See FIG. 7).

Similar to the PMOS vertical halo implant 510, the NMOS vertical halo implant 610 may be formed using a variety of different techniques. For example, an optimal technique has the NMOS vertical halo implant 610 being implanted at an angle substantially normal to the surface of the substrate 310. It is believed that any angle within 9 degrees to normal of the substrate 310 will suffice, however, it is further believed that any angle less than about 5 degrees is optimal. As indicated above, this is contrary to the method used to form the traditional halo implants.

The NMOS vertical halo implant 610, in contrast to traditional halo implants, may also be formed using a lower dose implant. For example, the NMOS vertical halo implant 610 may optimally be formed using a P-type dopant dose ranging from about 1E13 atoms/cm$^2$ to about 1E14 atoms/cm$^2$. This P-type dopant dose is generally about half of the conventional dose used to form the traditional halo implants. Nonetheless, the dose is high enough that a standard threshold voltage (V$_t$) implant will not suffice. Additionally, the NMOS vertical halo implant 610 may be implanted into the substrate 310 using a power ranging from about 5 keV to about 20 keV.

Figure 7:
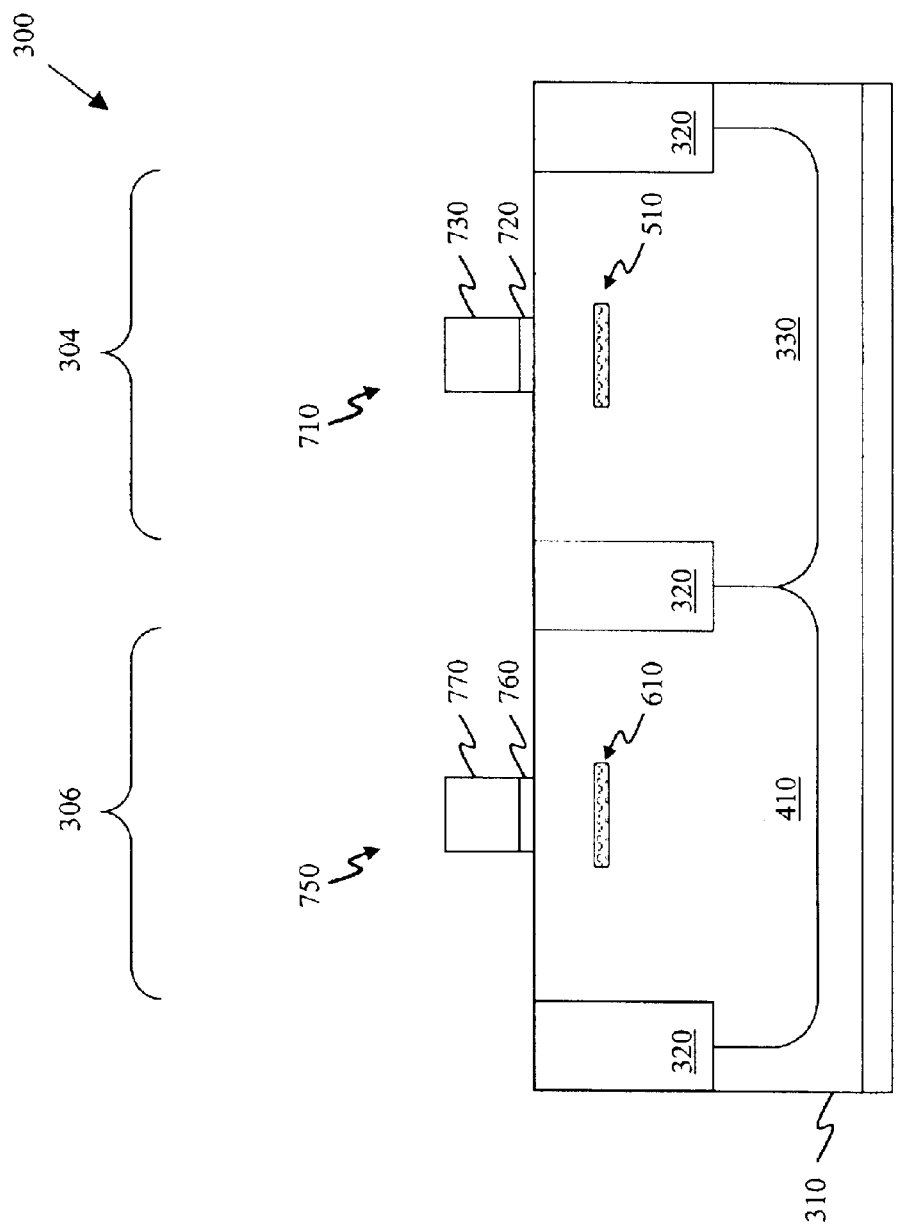
FIG. 7 illustrates a cross-sectional view of the partially completed semiconductor device illustrated in FIG. 6 after formation of conventional gate structures within the PMOS device region and NMOS device region.

Turning now to FIG. 7, illustrated is a cross-sectional view of the partially completed semiconductor device 300 illustrated in FIG. 6 after formation of conventional gate structures 710 and 750 within the PMOS device region 304 and NMOS device region 306, respectively. As is illustrated in FIG. 7, the gate structure 710 located within the PMOS device region 304 includes a gate oxide 720 and a gate 730, and the gate structure 750 located within the NMOS device region 306 includes a gate oxide 760 and a gate 770. As the gate structures 710, 750 are conventional, those skilled in the art understand the standard steps used for their manufacture.

Figure 8:
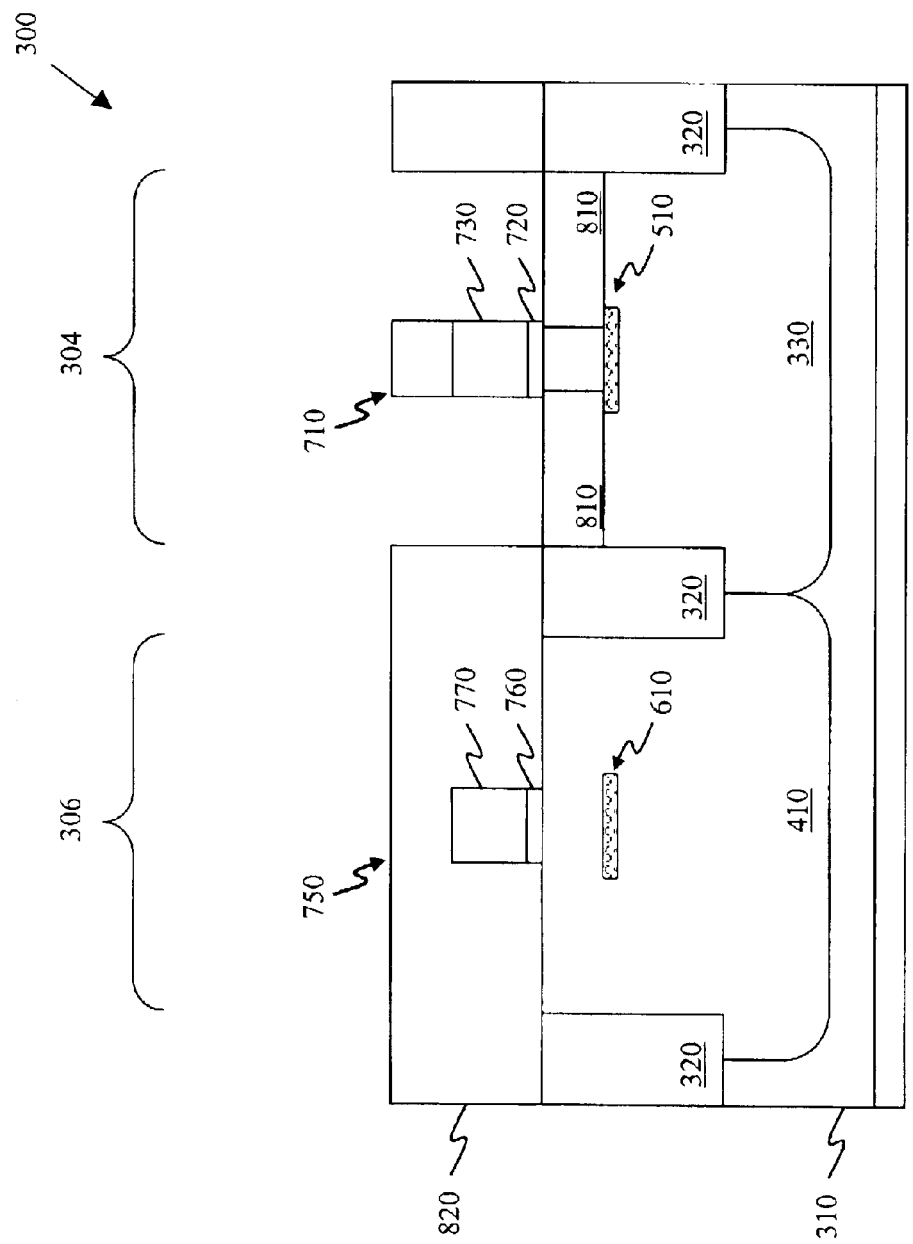
FIG. 8 illustrates a cross-sectional view of the partially completed semiconductor device illustrated in FIG. 7 after formation of source and drain regions within the PMOS device region of the substrate.

Turning now to FIG. 8, illustrated is a cross-sectional view of the partially completed semiconductor device 300 illustrated in FIG. 7 after formation of source and drain regions 810 within the PMOS device region 304 of the substrate 310. The source and drain regions 810 are conventionally formed and generally have a peak dopant concentration ranging from about 5E18 atoms/cm$^3$ to about 1E20 atoms/cm$_3$. Also, the source and drain regions 810 should typically have a dopant type opposite to that of the well region 310 they are located within. Accordingly, in the illustrative embodiment shown in FIG. 8, the source and drain regions 810 are doped with a P-type dopant.

Figure 9:
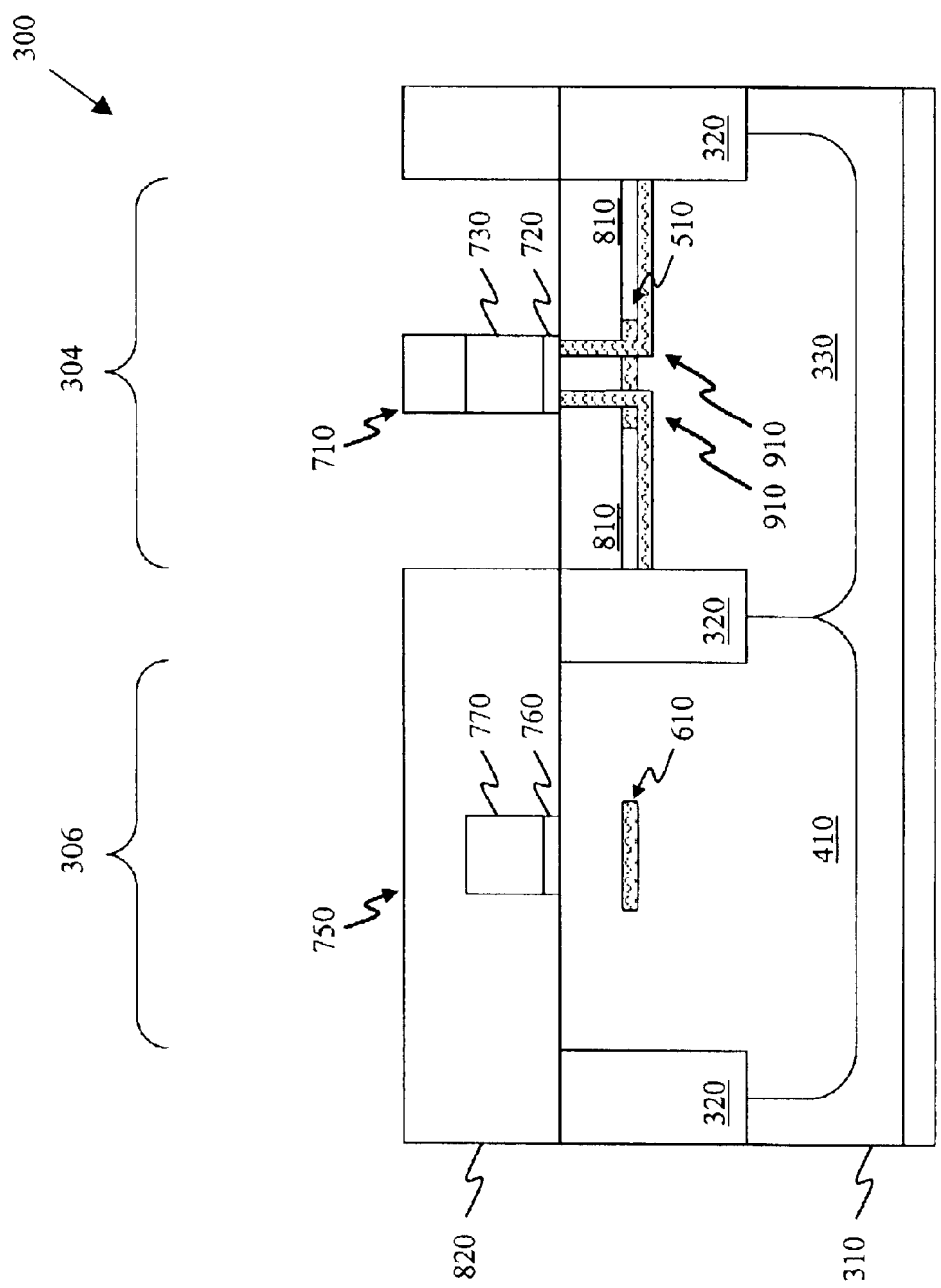
FIG. 9 illustrates a cross-sectional view of the partially completed semiconductor device illustrated in FIG. 8 after placing a PMOS angled halo implant within the substrate.

Turning now to FIG. 9, illustrated is a cross-sectional view of the partially completed semiconductor device 300 illustrated in FIG. 8 after placing a PMOS angled halo implant 910 within the substrate 310. Generally, the PMOS angled halo implant 910, similar to the PMOS vertical halo implant 510, comprises an N-type dopant. For example, in the illustrative embodiment shown in FIG. 5, the PMOS angled halo implant 910 includes a phosphorous or arsenic dopant and has a peak dopant concentration ranging from about 1E18 atoms/cm$^3$ to about 1E19 atoms/cm$^3$. While the particular dopant used and dopant concentration of the PMOS angled halo implant 910 has been given, those skilled in the art understand that the present invention should not be limited to such dopants and concentrations.

The PMOS angled halo implant 910 may be formed using a variety of different techniques. For example, an optimal technique has the PMOS angled halo implant 910 being implanted at an angle from about 20 degrees to about 40 degrees relative to the normal of the ,substrate 310 surface. This technique, in contrast to the technique used to form the PMOS vertical halo implant 510, is consistent with that used to form the traditional halo implant regions.

The PMOS angled halo implant 910, in contrast to traditional halo implants, may also be formed using a lower dose implant. For example, the PMOS angled halo implant 910 may optimally be formed using an N-type dopant dose ranging from about 1E13 atoms/cm$^2$ to about 1E14 atoms/cm$_2$. This N-type dopant dose is generally about half of the conventional dose used to form the traditional halo implants. Additionally, the PMOS angled halo implant 910 may be implanted into the substrate 310 using a power ranging from about 40 keV to about 100 keV.

Figure 10:
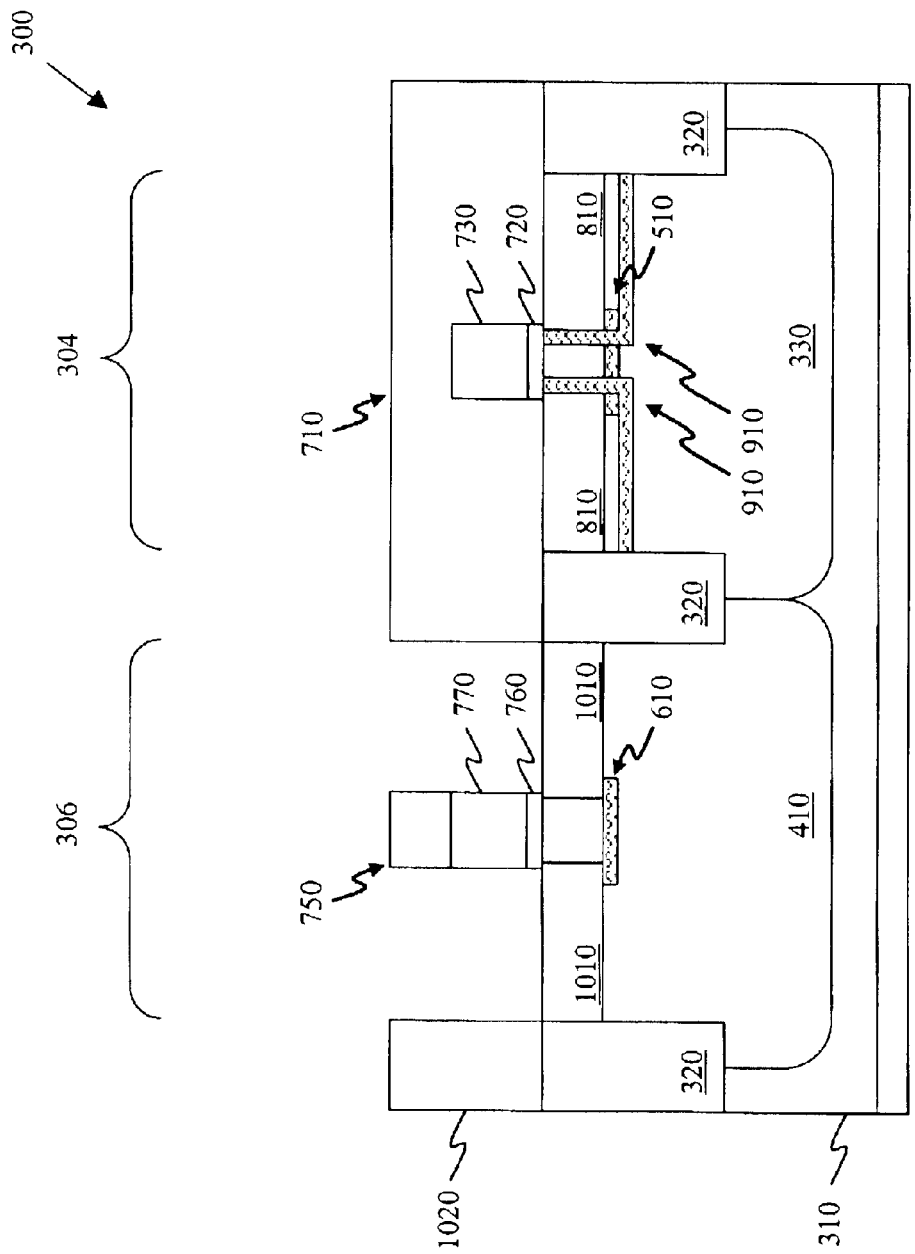
FIG. 10 illustrates a cross-sectional view of the partially completed semiconductor device illustrated in FIG. 9 after formation of source and drain regions within the NMOS device region of the substrate.

Turning now to FIG. 10, illustrated is a cross-sectional view of the partially completed semiconductor device 300 illustrated in FIG. 9 after formation of source and drain regions 1010 within the NMOS device region 306 of the substrate 310. The source and drain regions 1010 are conventionally formed and generally have a peak dopant concentration ranging from about 5E18 atoms/cm$^3$ to about 5E20 atoms/cm$^3$. Similar to the source and drain regions 810 disclosed above, the source and drain regions 1010 should have a dopant type opposite to that of the well region 410 they are located within. Accordingly, in the illustrative embodiment shown in FIG. 10, the source and drain regions 1010 are doped with an N-type dopant.

Figure 11:
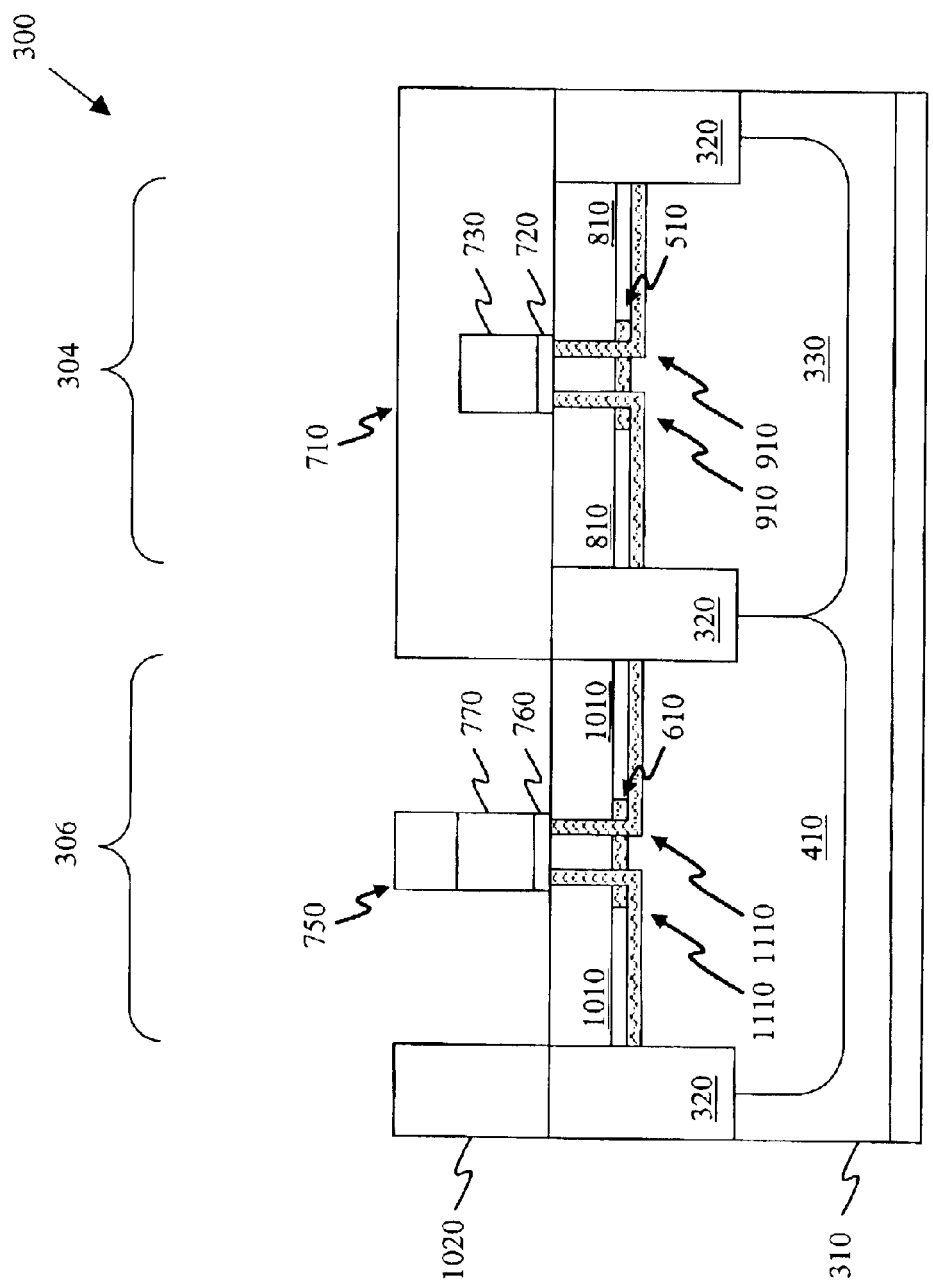
FIG. 11 illustrates a cross-sectional view of the partially completed semiconductor device illustrated in FIG. 10 after placing an NMOS angled halo implant within the substrate.

Turning now to FIG. 11, illustrated is a cross-sectional view of the partially completed semiconductor device 300 illustrated in FIG. 10 after placing an NMOS angled halo implant 1110 within the substrate 310. Generally, the NMOS angled halo implant 1110, similar to the NMOS vertical halo implant 610, comprises a P-type dopant. For example, in the illustrative embodiment shown in FIG. 11, the NMOS angled halo implant 1110 includes a phosphorous or arsenic dopant and has a peak dopant concentration ranging from about 1E18 atoms/cm³ to about 1E19 atoms/cm³. While the particular dopant used and dopant concentration of the NMOS angled halo implant 1110 has been given, those skilled in the art understand that the present invention should not be limited to such dopants and concentrations.

The NMOS angled halo implant 1110 may be formed using a variety of different techniques. For example, an optimal technique has the NMOS angled halo implant 1110 being implanted at an angle from about 20 degrees to about 40 degrees relative to the normal of the substrate 310 surface. This technique, in contrast to the technique used to form the NMOS vertical halo implant 610, is consistent with that used to form the traditional halo implant regions.

The NMOS angled halo implant 1110, in contrast to traditional halo implants, may also be formed using a lower dose implant. For example, the NMOS angled halo implant 1110 may optimally be formed using a P-type dopant dose ranging from about 1E13 atoms/cm² to about 1E14 atoms/cm$_2$. This P-type dopant dose is generally about half of the conventional dose used to form the traditional halo implants. Additionally, the NMOS angled halo implant 1110 may be implanted into the substrate 310 using a power ranging from about 5 keV to about 20 keV.

Figure 12:
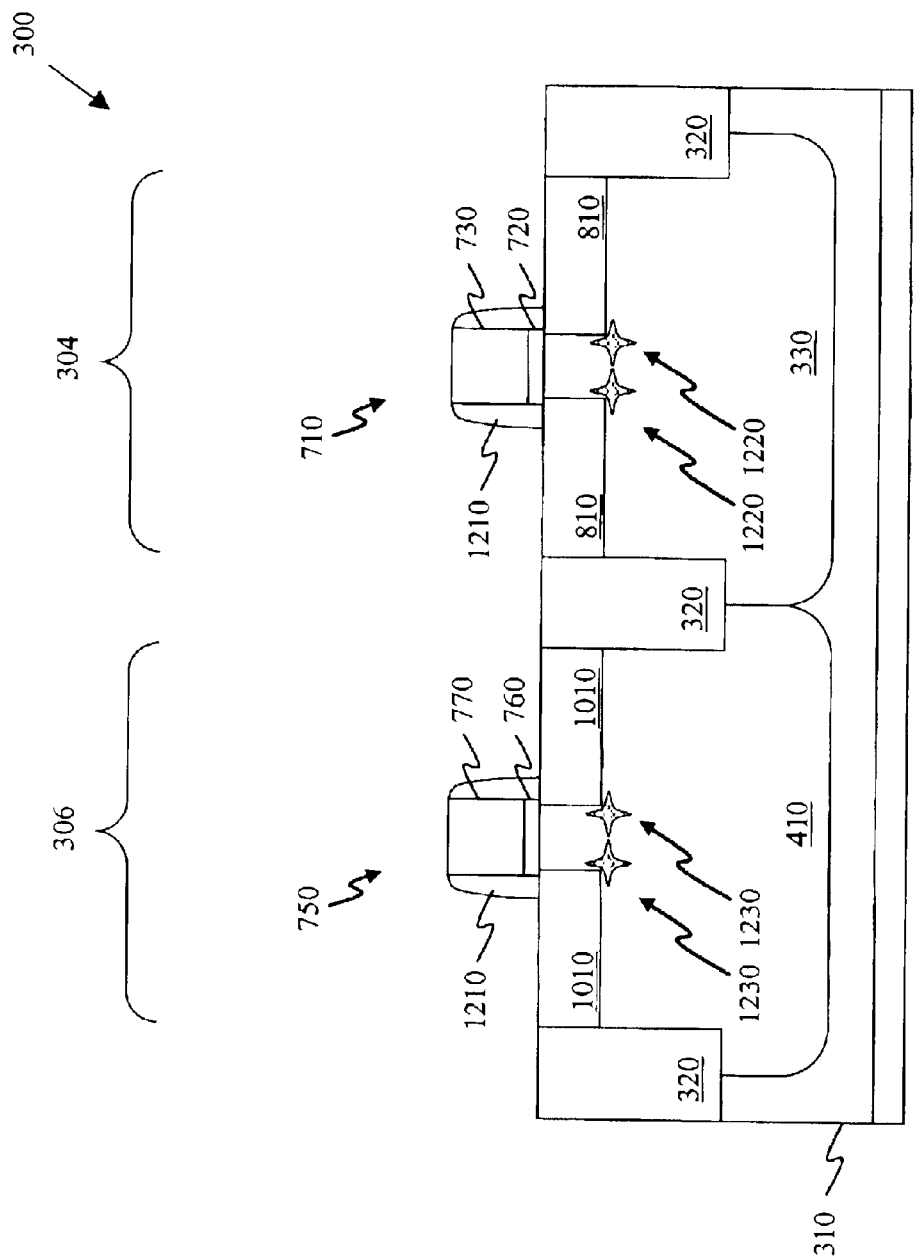
FIG. 12 illustrates a cross-sectional view of the partially completed semiconductor device illustrated in FIG. 11 after continuing manufacturing the semiconductor device.

Turning now to FIG. 12, illustrated is a cross-sectional view of the partially completed semiconductor device 300 illustrated in FIG. 11 after continuing manufacturing the semiconductor device 300. Among other steps in FIG. 12, is the formation of gate sidewall spacers 1210. Those skilled in the art understand the process for manufacturing the gate sidewall spacers 1210, including conformally depositing an oxide layer and performing a standard anisotropic etch thereon.

As is illustrated in FIG. 12, subsequent thermal processes may cause the PMOS vertical halo implant 510 and the PMOS angled halo implant 910 to combine to form the localized PMOS halo implants 1220. Those subsequent thermal processes may also cause the NMOS vertical halo implant 610 and the NMOS angled halo implant 1110 to combine to form the localized NMOS halo implants 1230. In one embodiment, what occurs as a result of these combinations, are the localized halo implants 1220, 1230, having areas of peak concentrations that are precisely located. For example, in the illustrative embodiment of FIG. 12, the localized halo implants 1220, 1230, are located at least partially under a footprint of the gates 730, 770, and below a surface of the substrate 310. As the areas of peak concentrations of the localized halo implants 1220, 1230, may be precisely located below the surface of the substrate 310, in contrast to the prior art structures, the aforementioned problems with channel mobility are substantially reduced.

Figure 13:
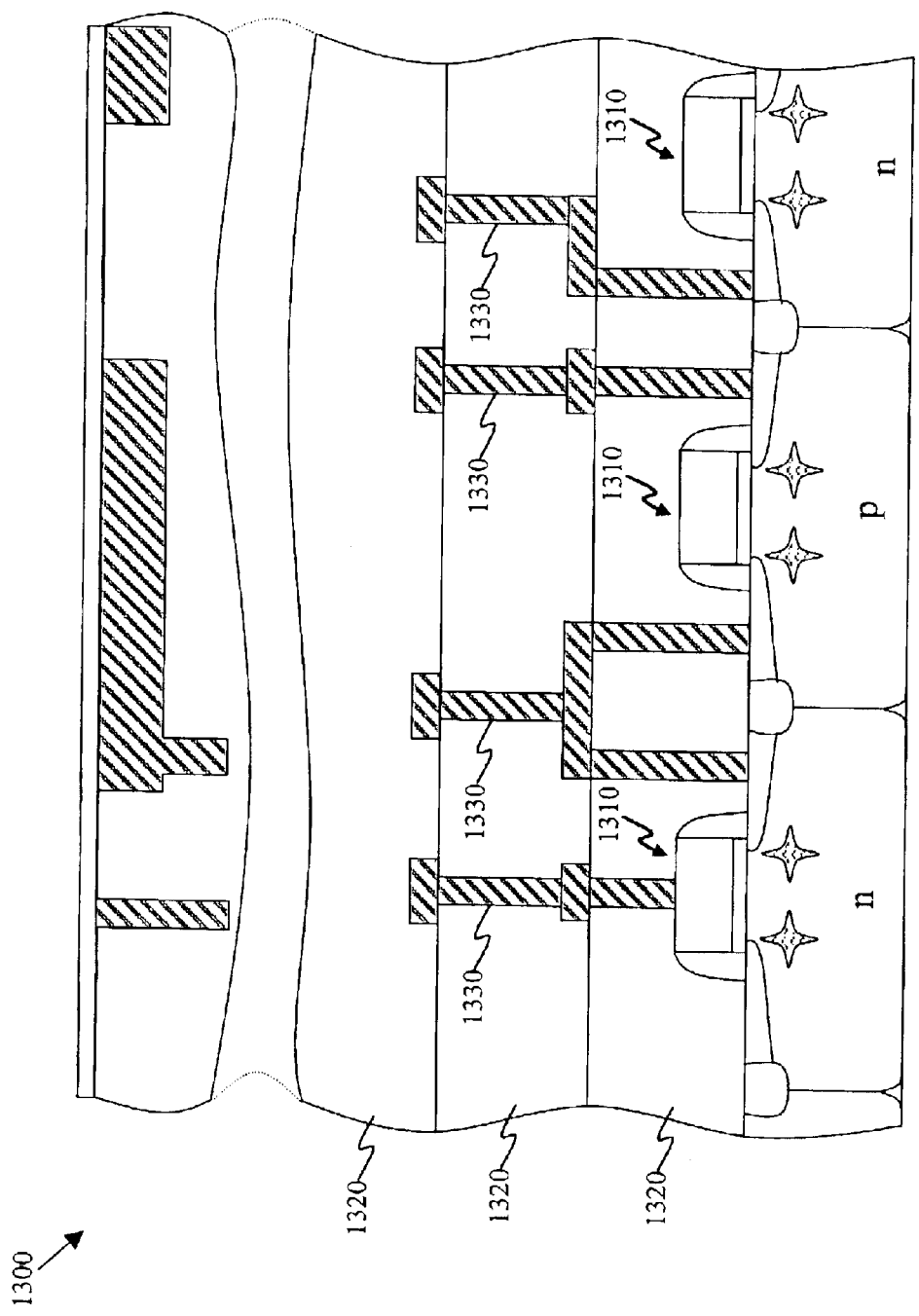
FIG. 13 illustrates a sectional view of a conventional integrated circuit (IC) incorporating a semiconductor device constructed according to the principles of the present invention.

Referring finally to FIG. 13, illustrated is a sectional view of a conventional integrated circuit (IC) 1300 incorporating semiconductor devices 1310 constructed according to the principles of the present invention. The IC 1300 may include devices, such as transistors used to form CMOS devices, BiCMOS devices, Bipolar devices, or other types of devices. The IC 1300 may further include passive devices, such as inductors or resistors, or it may also include optical devices or optoelectronic devices. Those skilled in the art are familiar with these various types of devices and their manufacture. In the particular embodiment illustrated in FIG. 13, the IC 1300 includes the semiconductor devices 1310 having dielectric layers 1320 located thereover. Additionally, interconnect structures 1330 are located within the dielectric layers 1320 to interconnect various devices, thus, forming the operational integrated circuit 1300.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:

forming a vertical implant region in a substrate;

forming a gate over said substrate following the formation of the vertical implant region; and forming an angled implant region in said substrate following the formation of the gate, wherein an intersection of said vertical implant region and said angled implant region form a localized halo implant having an area of peak concentration under said gate.

2. The method as recited in claim 1 wherein said localized halo implant is located at least partially under a footprint of said gate.

3. The method as recited in claim 2 wherein said area of peak concentration is located under said footprint of said gate.

4. The method as recited in claim 1 further including forming source and drains in said substrate, wherein said source and drains include a dopant type and said vertical implant region and said angled implant region of said localized halo implant include an opposite dopant type.

5. The method as recited in claim 1 wherein said area of concentration is located below a surface of said substrate.

6. The method as recited in claim 5 wherein said area of peak concentration is located from about 20 nm to about 60 nm below said surface of said substrate.

7. The method as recited in claim 1 wherein said area of peak concentration has a peak dopant concentration ranging from about 2E18 atoms/cm³ to about 2E19 atoms/cm³.

8. The method as recited in claim 1 wherein forming a vertical implant region includes forming a vertical implant region using a dopant dose ranging from about 1E13 atoms/cm² to about 1E14 atoms/cm$_2$ and forming an angled implant region includes forming an angled implant region using a dopant dose ranging from about 1E13 atoms/cm$_2$ to about 1E14 atoms/cm².

9. The method as recited in claim 1 wherein said forming a vertical implant region includes introducing an implant at an angle less than about 9 degrees from normal to said substrate surface, and wherein said forming an angle implant region includes introducing an implant at an angle from about 20 degrees to about 40 degrees relative to said normal of said substrate surface.

* * * * *